United States Patent [19]

Ota et al.

[11] Patent Number: 5,280,301
[45] Date of Patent: Jan. 18, 1994

[54] THERMAL HEAD

[75] Inventors: Shigenori Ota, Aira; Takuji Hashiguchi, Kokubu, both of Japan

[73] Assignee: Kyocera Corporation, Kyoto, Japan

[21] Appl. No.: 777,084

[22] Filed: Oct. 16, 1991

[30] Foreign Application Priority Data

Oct. 31, 1990 [JP] Japan .................. 2-114906[U]

[51] Int. Cl.⁵ .................................. B41J 2/345
[52] U.S. Cl. ................................ 346/76 PH
[58] Field of Search ............... 346/76; 219/543

[56] References Cited

U.S. PATENT DOCUMENTS

| | | | |
|---|---|---|---|
| 4,795,887 | 1/1989 | Myokan | 219/543 |
| 4,954,839 | 9/1990 | Rogers et al. | 346/76 PH |
| 4,963,886 | 10/1990 | Fukuda et al. | 346/76 PH |
| 4,972,205 | 11/1990 | Nagato | 346/76 PH |

FOREIGN PATENT DOCUMENTS

| | | |
|---|---|---|
| 0078786 | 5/1983 | Japan . |
| 0230873 | 11/1985 | Japan . |
| 0230874 | 11/1985 | Japan . |
| 0078859 | 3/1989 | Japan . |
| 0108561 | 4/1990 | Japan . |

*Primary Examiner*—Benjamin R. Fuller
*Assistant Examiner*—Huan Tran
*Attorney, Agent, or Firm*—Spensley Horn Jubas & Lubitz

[57] ABSTRACT

By dividing plural heating elements of a thermal head into plural blocks, when heating and driving by connecting drive circuit elements to the blocks, print data and control signals are fed to the drive circuit elements either parallel or in series to the drive circuit elements. In this case it is sometimes difficult to form fine circuit wirings on the insulating substrate, or buffers are needed for amplifying the signals when sequentially transferring print data among drive circuit elements. Therefore, a flexible wiring substrate is disposed near the drive circuit elements on the insulating substrate, and plural signal lines over the arranging range of the drive circuit elements, and connection lines for supplying signals to the drive circuit elements from the signal lines are formed on the wiring substrate. On the insulating substrate, connection lines of flexible wiring substrate and connection lines for connecting with the drive circuit elements are formed.

20 Claims, 6 Drawing Sheets

THERMAL HEAD

BACKGROUND OF THE INVENTION

1. Field of the Invention

The present invention relates to a thermal head.

2. Description of the Prior Art

The thermal head is used as a print output device for facsimile communication apparatus, computer or the like. In such thermal head, plural heating elements are linearly disposed on an insulating substrate made of ceramics, and common electrodes and individual electrodes are connected to the heating elements. The individual electrodes are connected by a plurality each to driving circuit elements realized as integrated circuit elements, for example, and desired heating elements are selectively energized and heated, thereby producing thermal printing on thermal paper or the like. At this time, regarding the individual electrodes, plural driving circuit elements, and input lines of signals from outside to the driving circuit elements, it is sometimes necessary to compose laminate wirings by crossing the circuit wirings.

On the other hand, on the surface of the insulating substrate made of ceramics, there are many fine undulations with height difference of several microns, and for example when forming common electrodes or individual electrodes by forming aluminum or gold by sputtering, evaporation or other thin film technique, and then etching, disconnections and short circuits of these circuit wirings often occur, and it is known that the yield is inferior.

Figure 1:
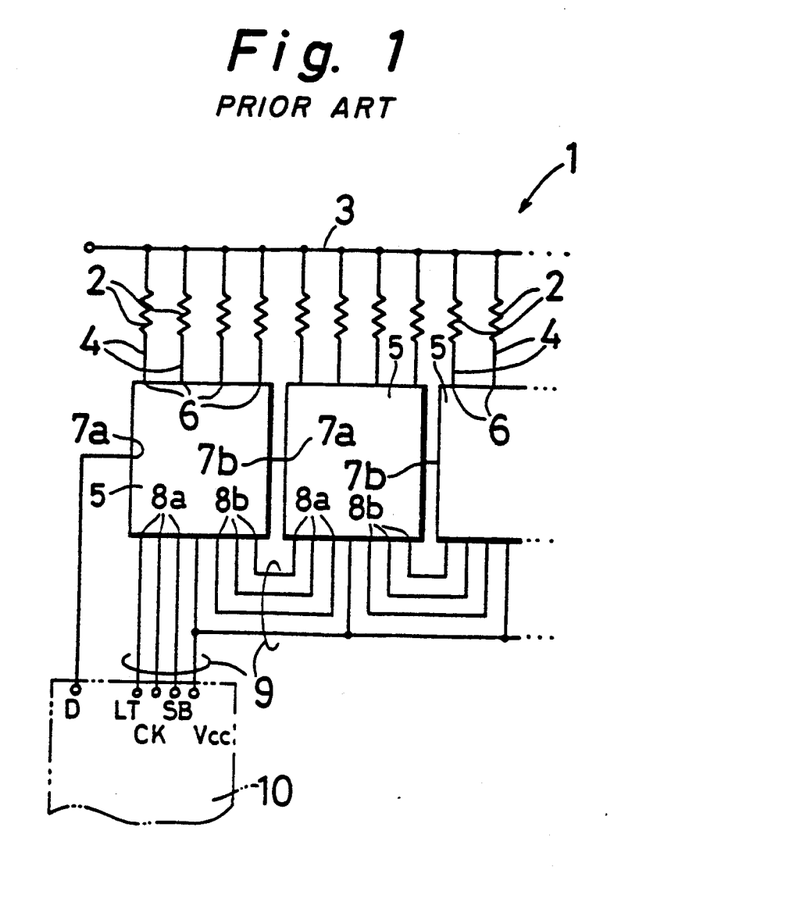
FIG. 1 is an electric circuit diagram of a typical conventional thermal head 1.

As the technique for solving such problems, the prior arts are disclosed in the Japanese Patent Publication No. 62-220794 and Japanese Laid-open Patent No. 60-230874 are known. The electric circuit diagram of thermal head 1 of such prior art is shown in FIG. 1. The thermal head 1 is composed of plural heating elements 2 linearly disposed on an insulating substrate made of ceramics, and common electrodes 3 and individual electrodes 4 are connected to the heating elements 2. The individual electrodes 4 are connected to output terminals 6 of driving circuit elements 5 composed as integrated circuit elements by every predetermined number. Input terminals 7a and output terminals 7b of driving circuit elements 5 are mutually and sequentially connected between adjacent driving circuit elements 5, and the data for thermal printing is sequentially transferred through each driving circuit element 5.

Plural input terminals 8a and plural output terminals 8b of the driving circuit elements 5 are the terminals for input and output of control signals, for example, latch signal, strobe signal and clock signal, and are mutually connected between adjacent driving circuit elements 5, same as the input terminals 7a and output terminals 7b.

In this conventional thermal head 1, it is designed to compose an equivalent circuit to the circuit winding crossing in each driving element 5, while avoiding laminate wiring of crossing of circuit wirings 9 on the insulating substrate not shown in the drawing. In such thermal head 1, however, it is known that the loss is large because printing data and control signals are transferred in each driving element 5. Therefore, in order to maintain the output signals of the driving circuit elements 5 at the same voltage level as the signals entered in the driving elements 5 in every control signal of print data, a buffer circuit must be disposed for each signal in each driving element 5, and it is difficult to reduce the size and simplify the structure of each driving element 5, and hence it is hard to reduce the cost.

It is also necessary to compose the transfer route of the print data and control signals within each driving element 5, and in this regard, too, the structure is increased in size and complicate.

Besides, the thermal head 1 consumes much power during use, and it is necessary to divide plural heating elements 2 by every predetermined number, and drive by time sharing in each division. In the case of such thermal head 1, when the capacity of the power source supplied is changed and changing the number of divisions, both the wiring pattern of the circuit wiring 9 on the insulating substrate, and the wiring pattern of external wiring 10 for supplying print data and control signal to this circuit wiring 9 must be modified, and it is necessary, for example, to prepare insulating substrate and external wiring 10 possessing a circuit wiring differing in wiring pattern for every type of power source capacity, which results in an increase in the number of parts and a complicated structure.

SUMMARY OF THE DISCLOSURE

It is hence a primary object of the invention to present a thermal head capable of solving the above technical problems reducing the size and simplifying the structure of the driving circuit elements, and curtailing the number of parts.

To achieve the above object embodiments of, the invention present a thermal head composed by forming common electrodes commonly connected to individual heating elements and individual electrodes connected to each heating element, on an insulating substrate on which plural heating elements are arranged linearly, dividing the plural heating elements into plural divisions, mounting driving circuit elements to which individual electrodes of each division is connected on the insulating substrate, disposing a wiring substrate on which plural conductive lines for feeding signals to the driving circuit elements near the driving circuit elements, and connecting the corresponding input terminals of the driving circuit elements individually to the conductive lines.

In the thermal head according to the an embodiment of the invention, the input terminals of the driving circuit elements disposed on the insulating substrate are individually connected to one end of the conductive lines of the wiring substrate for external connection formed on the insulating substrate. That is, when connecting the plural conductive lines in each driving circuit element, mutually crossed laminate wirings are formed. Such forming of laminate wiring on the insulating substrate, and forming of a composition equivalent to such laminate wiring in the driving circuit element may be avoided. As a result, if there are fine undulations on the surface of the insulating substrate, disconnection or shortcircuiting of laminate wiring may be avoided, and the reliability may be enhanced. Besides, from the driving circuit elements, the composition equivalent to the laminated wiring may be eliminated, and the structure may be reduced in size and simplified.

Thus, according to embodiments of the invention, forming of laminate wiring on the insulating substrate, or forming of a composition equivalent to laminate wiring in driving circuit elements may be avoided. Hence, if there are fine undulations on the surface of the insulating substrate, disconnection or shortcircuiting of laminate wiring may be avoided, and the reliability may be enhanced. Besides, from the driving circuit elements, the composition equivalent to the laminated wiring may be eliminated, and the structure may be reduced in size and simplified.

BRIEF DESCRIPTION OF THE DRAWINGS

Other and further objects, features and advantages of the invention will be more explicit from the following detailed description taken with reference to the drawings wherein.

DETAILED DESCRIPTION OF THE PREFERRED EMBODIMENTS

Now referring to the drawing, preferred embodiments of the invention are described below.

Figure 2:
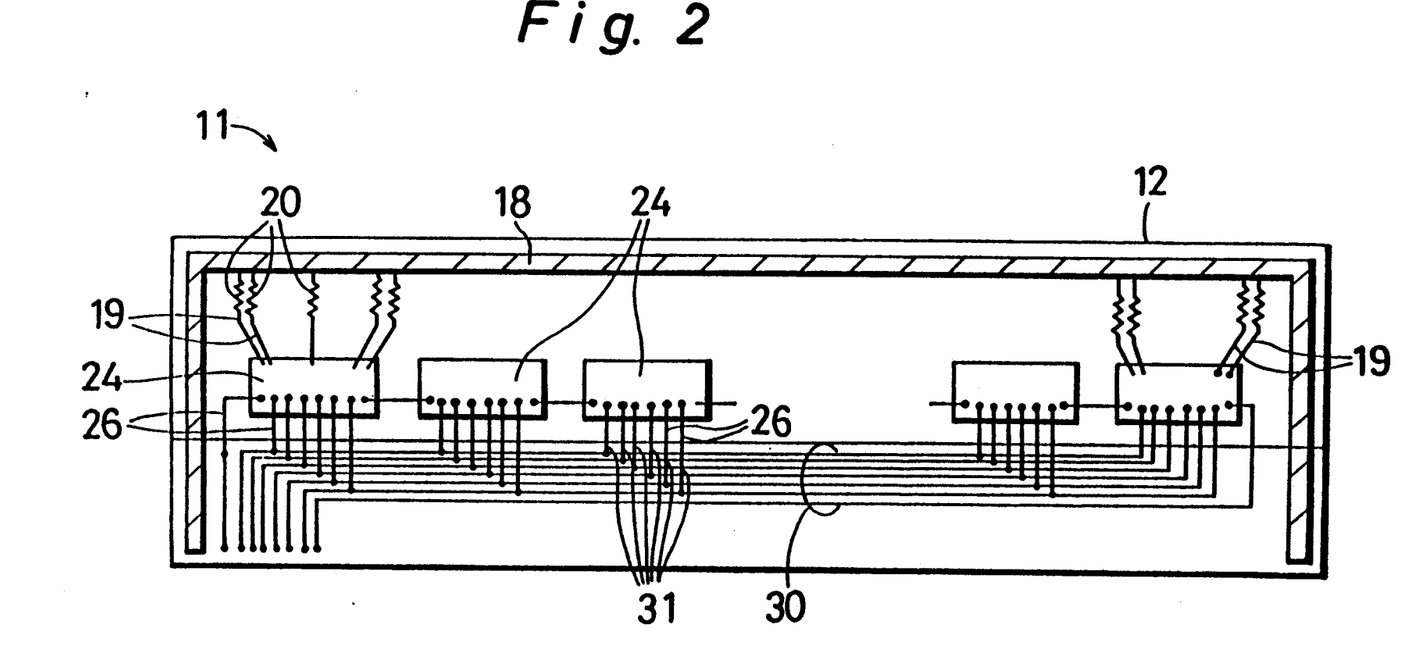
FIG. 2 is a plane view of a thermal head 11 of an embodiment of the invention.
Figure 3:
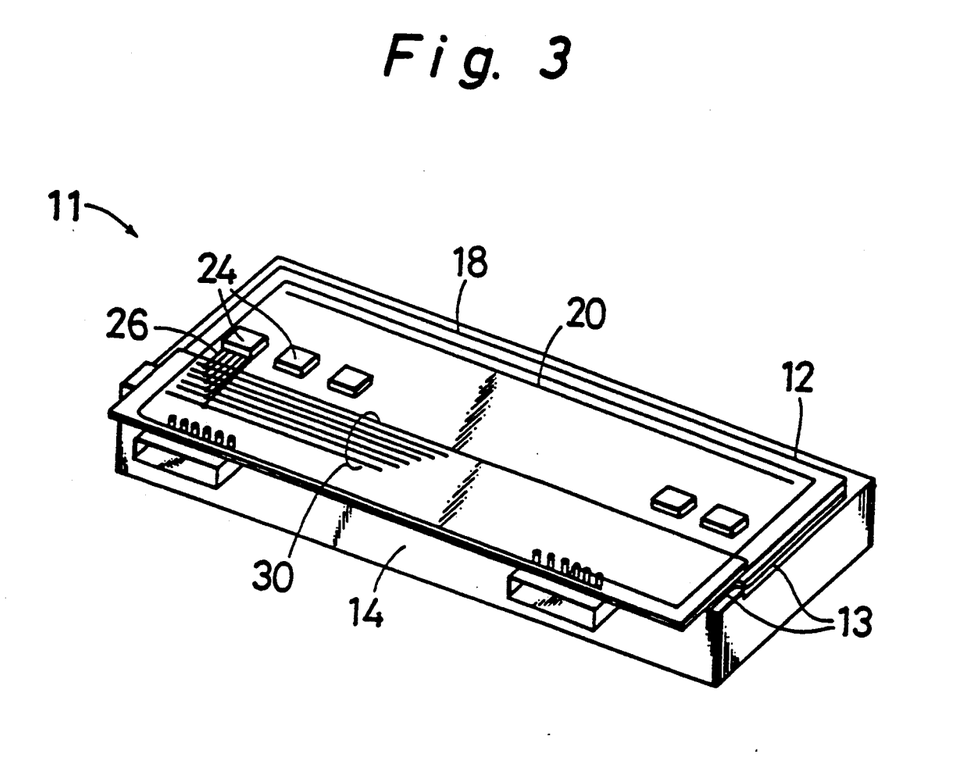
FIG. 3 is a perspective view of the thermal head 11.
Figure 4:
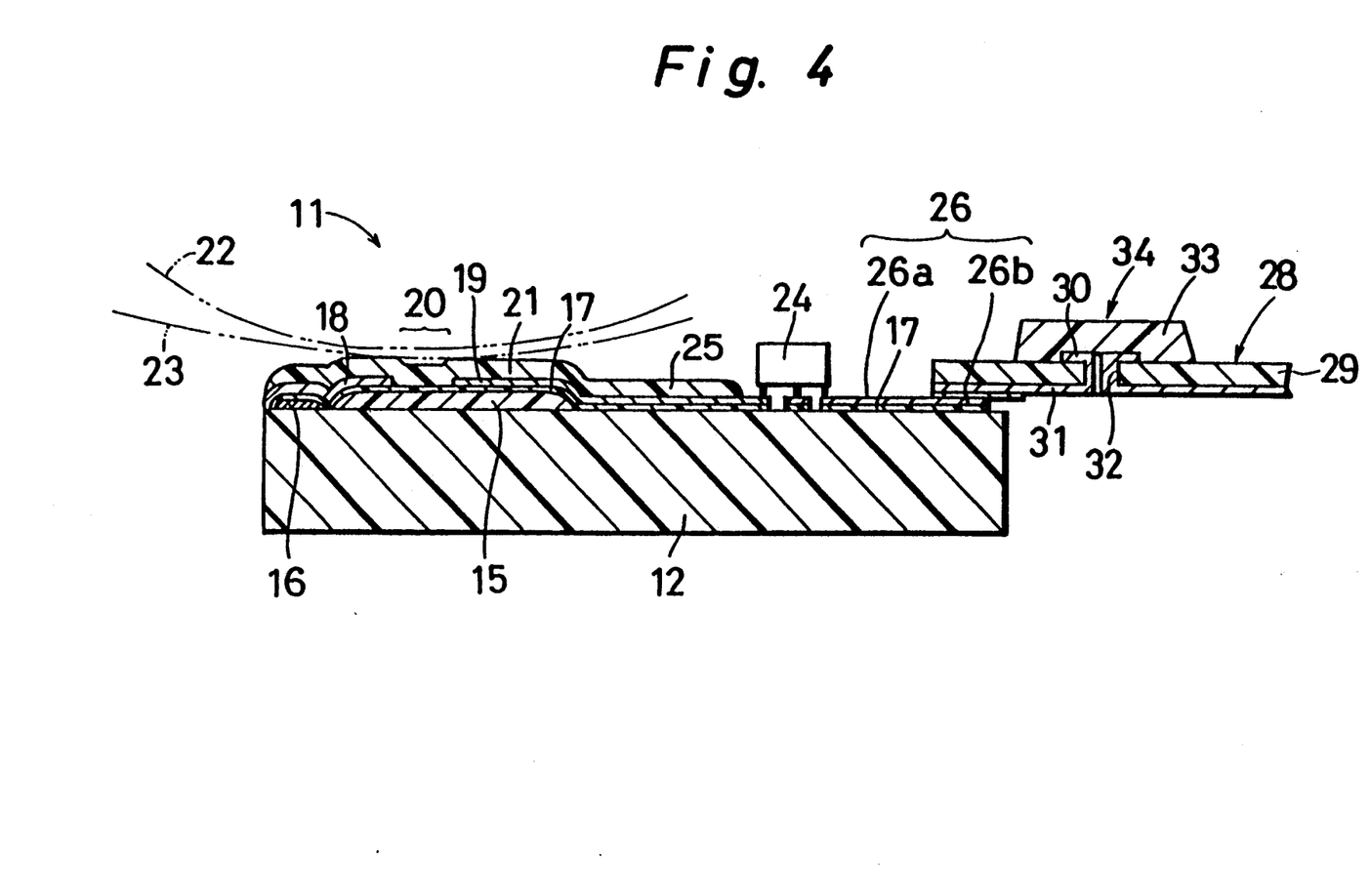
FIG. 4 is a sectional view of the thermal head 11.
Figure 5:
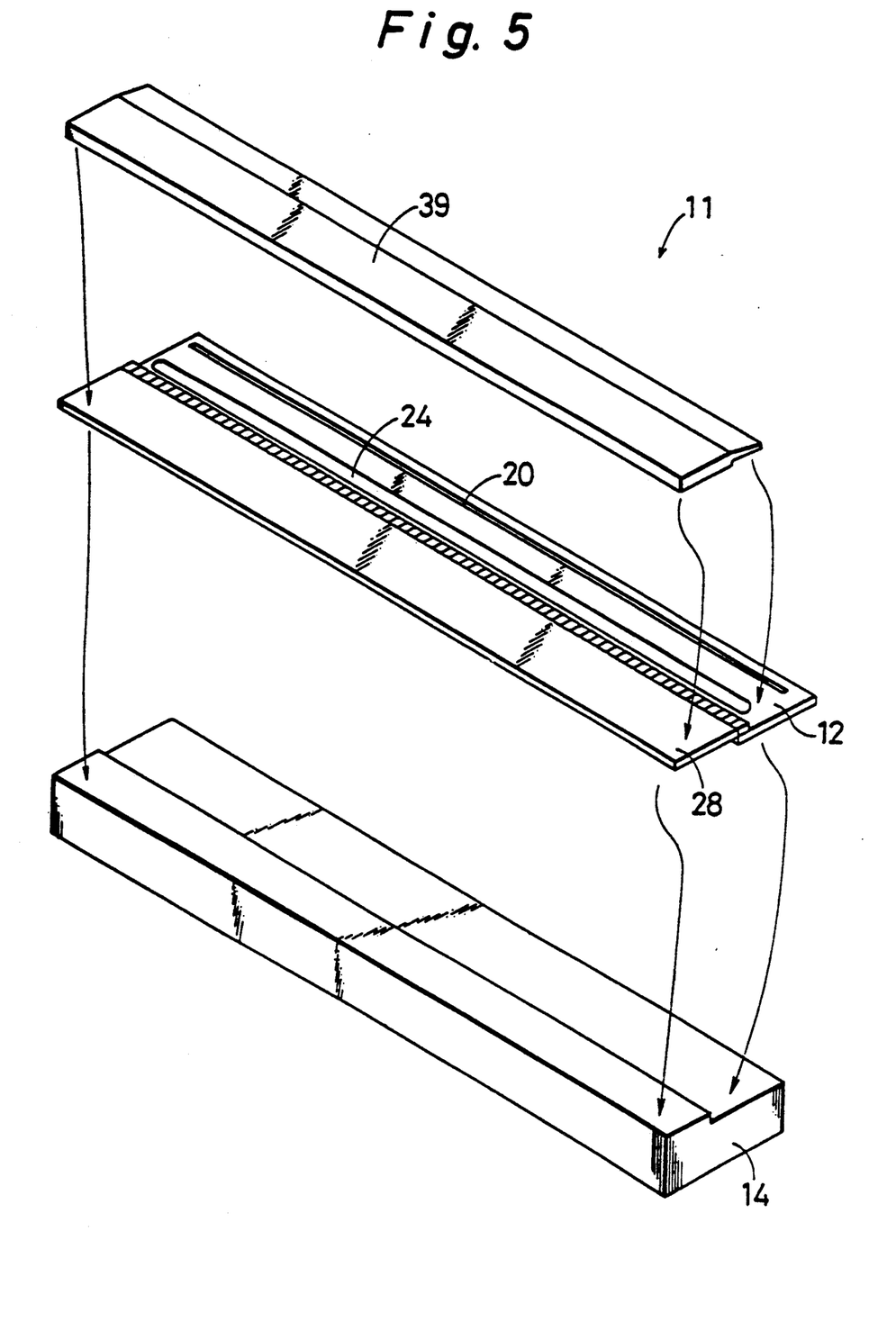
FIG. 5 is an exploded perspective view of a thermal head 11.

FIG. 2 is a plane view of a thermal head 11 in an embodiment of the invention, FIG. 3 is a perspective view of the thermal head 11, FIG. 4 is a sectional view of the thermal head 11, and FIG. 5 is an exploded perspective view of the thermal head 11. The thermal head 11 possesses an insulating substrate 12 of a rectangular flat plate made of a material possessing electric insulation and rigidity, for example, alumina ceramic. A cooling plate 14 made of metal such as aluminum is fixed to the insulating substrate 12 by means of an adhesive layer 13. A heat reserve layer 15 is formed on the insulating substrate 12 by thick film technique such as screen printing, and a thick film common electrode layer 16 is formed along the circumference of the insulating substrate 12.

On the heat reserve layer 15, a heating resistance layer 17, a common electrode layer 18, and plural individual electrodes 19 are formed, and plural heating elements 20 are composed. The heating elements 20 perform thermal printing on a thermal paper 23 together with a platen 22 through a wear resistance layer 21 made of, for example, silicon carbide SiC or tantalum oxide $Ta_2O_5$. The heating elements 20 are controlled by a drive circuit 24 realized as an integrated circuit element. The drive circuit 24 is connected with the individual electrodes 19 covered with an insulation layer 25, and a connection wiring 26 for feeding signals for driving the heating elements 20 to the drive circuit 24.

The drive circuit element 24 is provided with print data and various control signals from an external connection substrate 28 explained later through the connection wiring 26 formed on the insulating substrate 12. The connection wiring 26 comprises circuit wiring 26a and connection terminal 26b, and depending on the signal from the external connection substrate 28, the drive circuit element 24 supplies electric power for selectively heating the heating elements 20.

The external wiring substrate 28 is composed of a base film 29 made of synthetic material or the like possessing electric insulation, heat resistance and flexibility, for example, polyimide resin, and on the opposite surface against the insulating substrate 12 of the base film 29, signal lines 30 in the number corresponding to the plural control signals, and plural connection lines 31, extending along the arranging direction of the drive circuit element 24 and connected to the signal lines 30 at every drive circuit element 24 on the opposite surface of the base film 29 upon which the signal lines 30 are formed. On the connection lines 31, a protective film 33 made of synthetic resin material such as polyester resin or polyimide resin is formed.

On the external wiring substrate 28, as shown in FIG. 2, the signal lines 30 and connection lines 31 are formed in mutually crossing manner, and they are made to conduct by penetration holes 32 penetrating through the base film 29 as shown in FIG. 4 at connection points 34. A cover 39 is provided to cover the external connection substrate 38, drive circuit elements 24, and a part of individual electrodes 19.

When electrically connecting such external connection substrate 28 to the insulating substrate 12, as shown in FIGS. 2 to 4, the connection lines of the external connection substrate 28 are soldered and affixed to the external connection terminal 26b of the connection wiring 26 on the insulating substrate 12.

Figure 6:
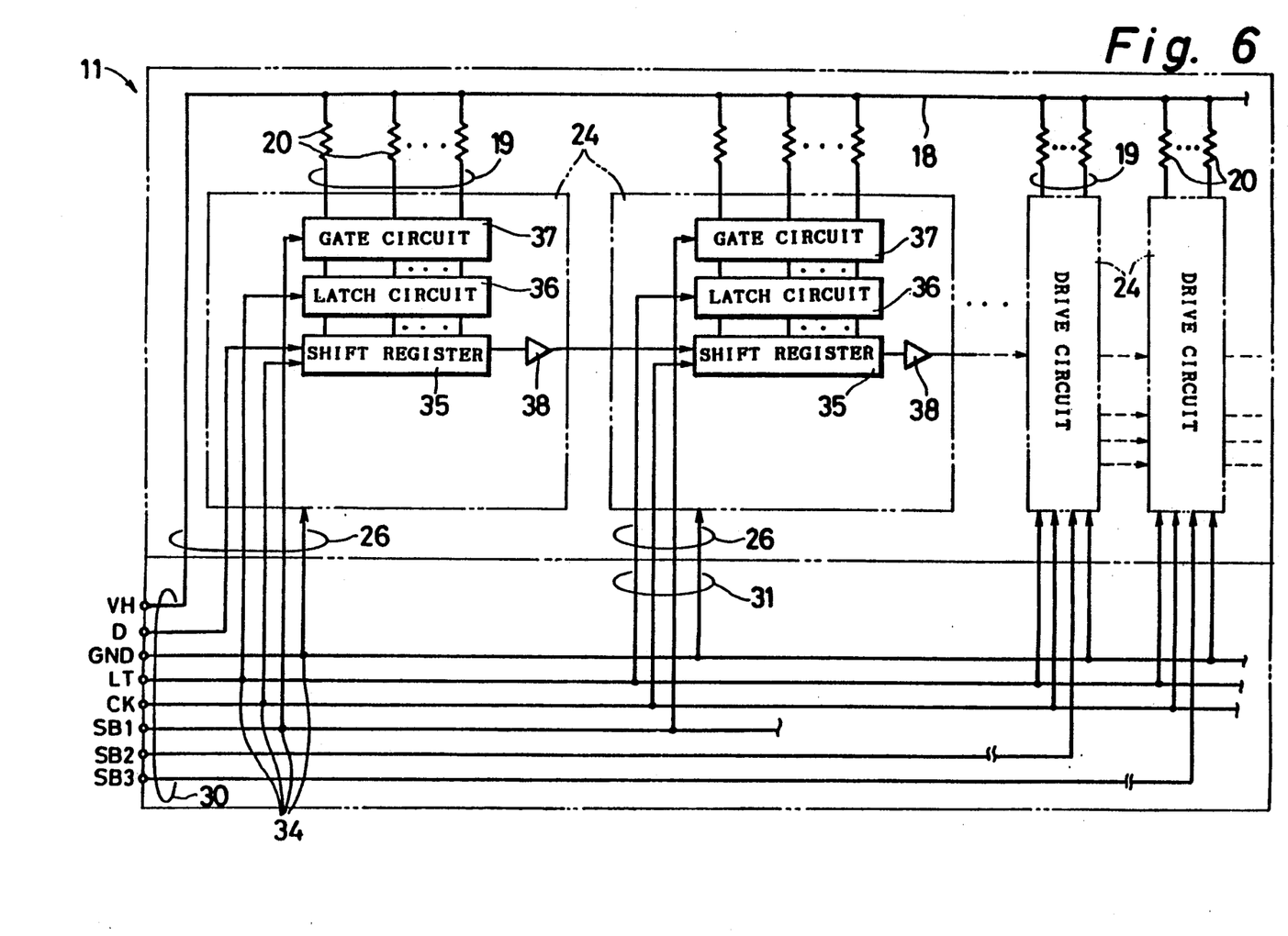
FIG. 6 is an electric circuit diagram of the thermal head 11.

FIG. 6 is a block diagram for explaining the electric composition of the thermal head 11. The insulating substrate 12 is provided with the connection wiring 26 as mentioned above, and it is connected with the connection line 31 of the external connection substrate 28. The signal lines 30 receive control signals from outside, such as the serial print data D for heating and driving the heating elements 20, latch signal LT, clock signal CK, and strobe signals SB1, SB2, SB3.

All drive circuit 24 have an identical constitution, and comprise a shift register 35 for receiving the print data D and clock signal CK, a latch circuit 36 for latching the input data in the shift register 35 with latch signal LT, and gate circuit 37 for delivering the print data D latched in the latch circuit 36 at the timing of the input of the strobe signal SB1 to each heating element 20.

Each drive circuit 24 is provided with a buffer circuit 38 for the shift register 35, and the output signal is set at the same voltage level as the input signal. This output is fed to the shift register 35 of the other adjacent drive circuit 24.

In this embodiment, the plural drive circuits 24 are divided into, for example, three blocks, and the print data D is sequentially transferred to all drive circuit elements 24 as mentioned above, and the latch signal LT and clock signal CK are fed in every drive circuit element 24 in all drive circuits 24 as mentioned above, and the strobe signals SB2, SB3 are fed into the drive circuit 24 of the initial stage in each block, and transferred with the block.

This constitution thus avoids laminate wiring of crossing of the connection wirings 26 on the insulating substrate 12, and also restricts formation of a circuit equivalent to a circuit wiring of crossing within each drive circuit element 24. Moreover, it is no longer necessary to install a buffer circuit for every signal in each drive circuit element 24, so that the drive circuit elements 24 may be reduced in size and simplified in structure, thereby reducing the cost.

In such thermal head 11, moreover, when the capacity of the power source supplied is changed and changing the number of divisions of the heating elements 20, it is not necessary to modify the wiring pattern of the connection wiring on the insulating substrate 12, and it is enough to change the external connection substrate 28 with one of other wiring pattern. Therefore, it is not necessary to prepare the insulating substrate 12 and external connection substrate 28 possessing connection wirings 26 different in the wiring patterns, and the number of parts is reduced, and the constitution of the thermal head 11 is simplified.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A thermal head comprising:
   a cooling plate;
   an electrically insulating substrate adhered with the cooling plate;
   a plurality of heating elements arranged in a line on the electrically insulating substrate, the plurality of heating elements being divided into plural divisions;
   a common electrode commonly connected to the plural heating elements;
   a plurality of individual electrodes, each connected to a respective one of said heating elements;
   a plurality of driving circuit elements supported by the electrically insulating substrate, each of said driving circuit elements connected to the individual electrodes which are connected to the heating elements in a respective division and each of said driving circuit elements having a plurality of input terminals;
   a wiring substrate soldered and affixed with the electrically insulating substrate; and
   a plurality of conductive lines disposed on the wiring substrate for feeding signals to the input terminals of the driving circuit elements, each of said conductive lines being electrically coupled to at least one input terminal of a plurality of driving circuit elements.

2. A thermal head comprising:
   an electrically insulating substrate;
   a common electrode commonly connected to individual heating elements arranged in a line and individual electrodes connected to each of said individual heating elements on the electrically insulating substrate on which said individual heating elements are arranged linearly, said individual heating elements being divided into plural divisions;
   driving circuit elements to which individual electrodes of each of said divisions is connected on the electrically insulting substrate, each of said driving circuit elements having a plurality of input terminals; and
   a wiring substrate on which plural conductive lines for feeding signals to the driving circuit elements disposed near the driving circuit elements, wherein the input terminals of the driving circuit elements are connected individually to the conductive lines; and
   wherein the wiring substrate comprises:
   a base film made of a material having electric insulation and flexibility properties, the base film having a first surface facing the electrically insulting substrate and a second oppositely facing surface,
   plural signal lines extending in a direction parallel to the line of heating elements, on the second surface of the base film and
   plural connection lines individually connected with the plural signal lines, the plural connection lines extending in a direction intersecting the direction of the line of heating elements, on the first surface of the base film.

3. A thermal head as recited in claim 2, further comprising a cooling plate to which the electrically insulating substrate is adhered.

4. A thermal head as recited in claim 2, wherein the wiring substrate is soldered and affixed to the electrically insulating substrate.

5. A thermal head as recited in claim 3, wherein the wiring substrate is soldered and affixed to the electrically insulating substrate.

6. A thermal head operable with control signals, the thermal head comprising:
   a cooling plate;
   a first substrate adhered to the cooling plate;
   a plurality of heating elements;
   a plurality of driving circuit elements supported by the first substrate, each of said driving circuit elements having a number of first input terminals for receiving control signals and a plurality of output terminals electrically coupled to selectively drive a corresponding plurality of heating elements in accordance with control signals received by the first input terminals;
   a plurality of first connection conductors corresponding in number to the number of first input terminals of the plural driving circuit elements, each of said first connection conductors being supported by the first substrate and being electrically coupled to a respective driving circuit element input terminal;
   a second substrate soldered to and affixed with the first substrate;
   a plurality of second connection conductors corresponding in number to the number of first connection conductors, each of said second connection conductors being supported by the second substrate and being electrically coupled with a respective first connection conductor; and
   a plurality of signal conductors for conveying control signals, each of said signal conductors being supported by the second substrate in electrical communication with a respective input terminal of at least two of the driving circuit elements through first and second connection conductors.

7. A thermal head as recited in claim 6, wherein the plurality of driving circuit elements are arranged in a row on the first substrate and wherein the plurality of signal conductors comprise a plurality of conduction lines arranged substantially parallel to the row of driving circuit elements.

8. A thermal head as recited in claim 7, wherein a plurality of the second connection conductors traverse without electrically contacting at least one of the signal conductors.

9. A thermal head as recited in claim 8, wherein the second substrate has first and second opposing surfaces, the plurality of signal connectors are provided adjacent the first surface and the second connection conductors are provided adjacent the second surface of the second substrate.

10. A thermal head as recited in claim 9, further comprising a plurality of conductive connectors extending through the second substrate, each connection conductor is connected to one of the signal conductors.

11. A thermal head as recited in claim 10, wherein the control signals include a clock signal, a latch signal, a first strobe signal and a second strobe signal and wherein the plurality of signal conductors comprise a first signal line for conveying the latch signal, a second signal line for conveying the clock signal, a third signal line for conveying the first strobe signal and a fourth signal line for conveying the second strobe signal.

12. A thermal head as recited in claim 6, wherein a plurality of the second connection conductors traverse without electrically contacting at least one of the signal conductors.

13. A thermal head as recited in claim 6, wherein the second substrate has first and second opposing surfaces, the plurality of signal connectors are provided adjacent the first surface and the second connection conductors are provided adjacent the second surface of the second substrate.

14. A thermal head as recited in claim 6, wherein the plurality of heating elements are supported by the first substrate.

15. A thermal head as recited in claim 6, wherein the control signals include a clock signal, a latch signal, a first strobe signal and a second strobe signal and wherein the plurality of signal conductors comprise a first signal line for conveying the latch signal, a second signal line for conveying the clock signal, a third signal line for conveying the first strobe signal and a fourth signal line for conveying the second strobe signal.

16. A thermal head operable with control signals, the thermal head comprising:
 a first substrate;
 a plurality of heating elements divided into plural divisions;
 a plurality of driving circuit elements, each of said driving circuit having a plurality of input terminals for receiving control signals, each of said driving circuit elements being supported by the first substrate and being electrically coupled to each of said heating elements of a respective division for selectively driving each heating element of the division in accordance with control signals received at the input terminals;
 a second substrate having first and second opposing surfaces;
 a plurality of connection conductors supported by the second substrate adjacent the first surface thereof, each of said connection conductors being arrangeable in electrical communication with a respective input terminal of the plurality of driving circuit elements; and
 a plurality of signal conductors for conveying control signals, each of said signal conductors being supported by the second substrate adjacent the second surface thereof and being electrically coupled to at least one of the connection conductors.

17. A thermal head as recited in claim 16, wherein each of said signal conductors is electrically coupled to a plurality of the connection conductors.

18. A thermal head as recited in claim 16, wherein the plurality of driving circuit elements are arranged in a row on the first substrate and wherein the plurality of signal conductors comprise a plurality of conduction lines arranged substantially parallel to the row of driving circuit elements upon the connection conductors supported by the second substrate being arranged in electrical communication with the input terminals of the driving circuit elements.

19. A thermal head as recited in claim 16, wherein a plurality of the connection conductors traverse without electrically contacting at least one of the signal conductors.

20. A thermal head as recited in claim 16, further comprising a plurality of conductive connectors extending through the second substrate, each of said conductive connectors being connected to one of the signal conductors.

* * * * *